(12) United States Patent
Ikarashi

(10) Patent No.: US 7,292,108 B2
(45) Date of Patent: Nov. 6, 2007

(54) VOLTAGE CONTROLLED OSCILLATOR FOR FREQUENCY SYNTHESIZER

(75) Inventor: Yasuhiro Ikarashi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 72 days.

(21) Appl. No.: 10/999,712

(22) Filed: Nov. 30, 2004

(65) Prior Publication Data

US 2005/0122177 A1    Jun. 9, 2005

(30) Foreign Application Priority Data

Dec. 8, 2003    (JP)    ............... 2003-408569

(51) Int. Cl.
*H03B 1/00* (2006.01)

(52) U.S. Cl. ............... 331/36 L; 331/60; 331/117 R; 331/117 FE

(58) Field of Classification Search ............... 331/76, 331/36 L, 60, 117 R, 117 FE
See application file for complete search history.

(56) References Cited

U.S. PATENT DOCUMENTS

| 4,864,636 | A | 9/1989 | Brunius |
| 5,263,197 | A | 11/1993 | Manjo et al. |
| 6,380,813 | B1 * | 4/2002 | Noumi et al. ............... 331/49 |
| 6,667,666 | B2 * | 12/2003 | Uzunoglu ............... 331/173 |
| 2003/0011438 | A1 | 1/2003 | Uzunoglu |

FOREIGN PATENT DOCUMENTS

| EP | 1 056 192 | 11/2000 |
| GB | 925 395 | 5/1963 |
| GB | 1 357 187 | 6/1974 |
| JP | H10-126262 | 5/1998 |
| JP | H11-168324 | 6/1999 |

\* cited by examiner

*Primary Examiner*—Robert Pascal
*Assistant Examiner*—Levi Gannon
(74) *Attorney, Agent, or Firm*—Brinks Hofer Gilson & Lione

(57) ABSTRACT

The voltage controlled oscillator includes an oscillating transistor, and first and second inductance elements which are connected in series and provided between an output terminal of the oscillating transistor and a high frequency ground point Vcc. Oscillating signals are output from the output terminal of the oscillating transistor and a connecting point between the first inductance element and the second inductance element, respectively. The output terminal of the oscillating transistor outputs a fundamental wave having a high level, and the connecting point between two inductance elements outputs the harmonic wave, suppressing the fundamental wave.

4 Claims, 3 Drawing Sheets ized Patent Application No. 2003-408569 filed on Dec. 8, 2003, herein incorporated by reference.

VOLTAGE CONTROLLED OSCILLATOR FOR FREQUENCY SYNTHESIZER

This application claims the benefit of priority to Japanese Patent Application No. 2003-408569 filed on Dec. 8, 2003, herein incorporated by reference.

BACKGROUND OF THE INVENTION

1. Field of the Invention

The present invention relates to a voltage controlled oscillator.

2. Description of the Related Art

A conventional frequency synthesizer using a voltage controlled oscillator comprises a reference oscillator 1, a frequency divider 5 for dividing a frequency by M (f0/M) such that an oscillating frequency f0 of a voltage controlled oscillator 4 is equal to an oscillating frequency fr of the reference oscillator 1, a phase comparator 2 for comparing the output phase of the reference oscillator 1 with the output phase of the frequency divider 5 to detect a phase difference, and a low-pass filter 3 for removing unnecessary harmonic wave components included in the output of the phase comparator 2, as shown in FIG. 5.

In such a structure, a feedback function that the phase difference between fr and f0/M becomes always zero is performed, and the output phase of the voltage controlled oscillator 4 is synchronized with the output phase of the reference oscillator 1, thereby obtaining high stability oscillation in accordance with the phase precision of the reference oscillator 1.

In the conventional example, the harmonic wave components (2f0, 3f0,) of a high order and a fundamental wave component f0 are simultaneously output from the voltage controlled oscillator 4. Therefore, a band-pass filter 6 selects the fundamental wave, and a multiplier 7 multiplies the output of the band-pass filter 6 by N, thereby obtaining a desired oscillating frequency N×fo (for example, see Japanese unexamined Patent Application Publication No. 10-126262 (FIG. 5).

In the conventional structure, the voltage controlled oscillator outputs the fundamental wave and the harmonic wave from only one output terminal thereof and oscillates with a frequency lower than a predetermined frequency. Also, the multiplier generates an oscillating signal having a desired frequency by using the fundamental wave output from the voltage controlled oscillator. Therefore, the band-pass filter and the multiplier are required. As a result, the structure of the frequency synthesizer becomes complicated, and thus the miniaturization thereof cannot be accomplished.

SUMMARY OF THE INVENTION

Accordingly, an object of the present invention is to provide a voltage controlled oscillator capable of simplifying the structure of a frequency synthesizer.

In order to achieve the above-mentioned object, the present invention provides a voltage controlled oscillator comprising: an oscillating transistor; and first and second inductance elements which are connected in series and are provided between an output terminal of the oscillating transistor and a high frequency ground point, in which oscillating signals are output from the output terminal of the oscillating transistor and a connecting point between the first inductance element and the second inductance element, respectively.

Further, a buffer amplifier for amplifying the oscillating signal is provided, and the connecting point between the first inductance element and the second inductance element is coupled to an input terminal of the buffer amplifier.

Furthermore, the first inductance element is provided at the side of the high frequency ground point, and the second inductance element is provided at the side of the output terminal of the oscillating transistor. A parallel resonance circuit is constructed by connecting a first capacitive element to the first inductance element in parallel, and the parallel resonance circuit resonates with the frequency of a specific harmonic wave included in the oscillating signal.

Moreover, the first inductance element is provided at the side of the high frequency ground point, and the second inductance element is provided at the side of the output terminal of the oscillating transistor. A second capacitive element is connected to the second inductance element in parallel.

Further, the high frequency ground point is a power supply terminal, and the output terminal of the oscillating transistor is a collector. A power supply voltage is applied from the power supply terminal to the collector of the oscillating transistor through the first and second inductance elements.

Furthermore, the buffer amplifier has an amplifying transistor whose emitter is grounded, and a collector of the amplifying transistor is applied with a voltage from the emitter of the oscillating transistor.

According to a first aspect of the present invention, a voltage controlled oscillator comprises an oscillating transistor; and first and second inductance elements which are connected in series and are provided between an output terminal of the oscillating transistor and a high frequency ground point, in which oscillating signals are output from the output terminal of the oscillating transistor and a connecting point between the first inductance element and the second inductance element, respectively. Therefore, the output terminal of the oscillator transistor can output a fundamental wave having a high level, and the connecting point between two inductance elements can output a harmonic wave suppressing the fundamental wave. In this way, the voltage controlled oscillator can stably oscillate with the fundamental wave, and the harmonic wave can be used as a desired oscillating signal.

In addition, according to a second aspect of the resent invention, a buffer amplifier for amplifying the oscillating signal is provided, and the connecting point between the first inductance element and the second inductance element is coupled to an input terminal of the buffer amplifier. Therefore, the level of the desired harmonic wave can be increased.

Furthermore, according to a third aspect of the present invention, the first inductance element is provided at the side of the high frequency ground point, and the second inductance element is provided at the side of the output terminal of the oscillating transistor. A parallel resonance circuit is constructed by connecting a first capacitive element to the first inductance element in parallel, and the parallel resonance circuit resonates with the frequency of a specific harmonic wave included in the oscillating signal. Therefore, only a specific harmonic-wave can be efficiently output.

Also, according to a fourth aspect of the present invention, the first inductance element is provided at the side of the high frequency ground point, and the second inductance element is provided at the side of the output terminal of the oscillating transistor. A second capacitive element is connected to the second inductance element in parallel. Therefore, the level of the harmonic wave output to the second output terminal can be increased.

In addition, according to a fifth aspect of the present invention, the high frequency ground point is a power supply terminal, and the output terminal of the oscillating transistor is a collector. A power supply voltage is applied from the power supply terminal to the collector of the oscillating transistor through the first and second inductance elements. Therefore, a voltage controlled oscillator of a collector ground type can be constructed.

Further, according to a sixth aspect of the present invention, the buffer amplifier has an amplifying transistor whose emitter is grounded, and a collector of the amplifying transistor is applied with a voltage from the emitter of the oscillating transistor. Therefore, the harmonic wave can be amplified without increasing current consumption.

DESCRIPTION OF THE PREFERRED EMBODIMENT

Figure 1:
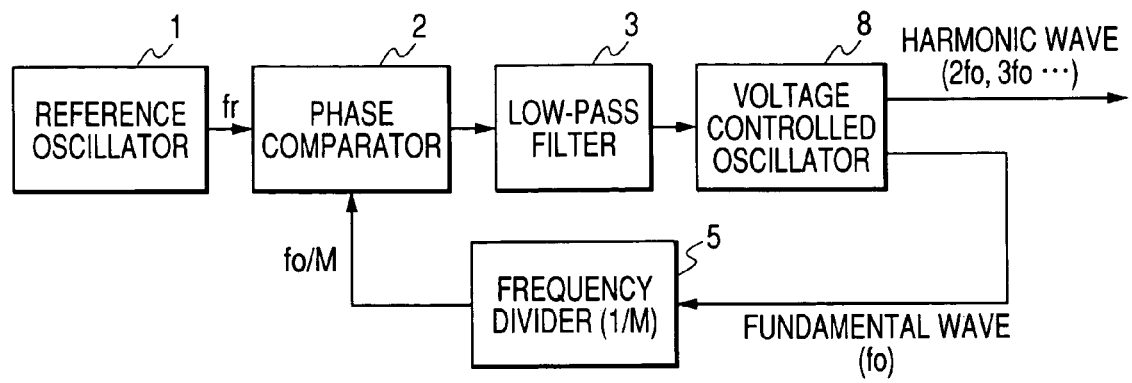
FIG. 1 is a circuit diagram of a frequency synthesizer using a voltage controlled oscillator according to the present invention.

A frequency synthesizer using a voltage controlled oscillator according to the present invention will be described with reference to FIGS. 1 to 3. First, the frequency synthesizer comprises a reference oscillator 1, a frequency divider 5 for dividing a frequency by M (f0/M) so that a fundamental oscillating frequency f0 of a voltage controlled oscillator 8 is equal to an oscillating frequency fr of the reference oscillator 1, a phase comparator 2 for comparing the output phase of the reference oscillator 1 with the output phase of the frequency divider 5 to detect a phase difference therebetween, and a low-pass filter 3 for removing unnecessary harmonic wave components included in the output of the phase comparator 2.

In such a structure, a feedback function that the phase difference between the frequencies fr and f0/M becomes always zero is performed, and the output phase of the fundamental wave from the voltage controlled oscillator 8 is synchronized with the output phase of the reference oscillator 1, thereby obtaining high stability oscillation in accordance with the phase precision of the reference oscillator 1.

Figure 2:
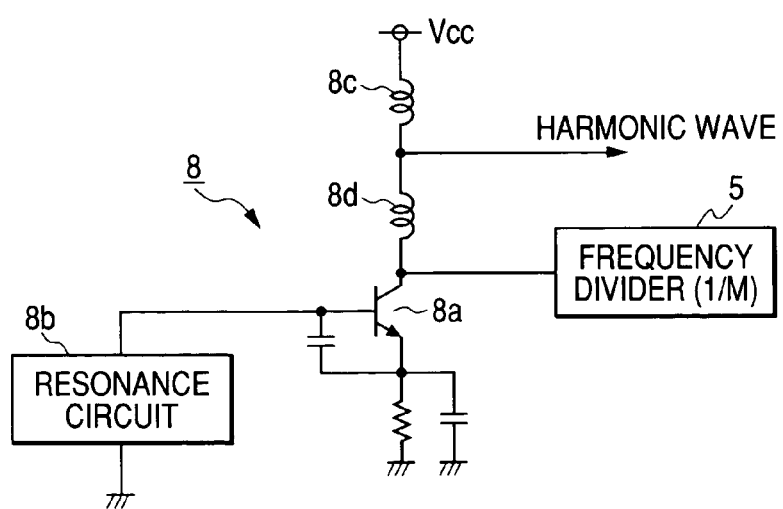
FIG. 2 is a circuit diagram showing the structure of the voltage controlled oscillator according to the present invention.

As shown in FIG. 2, the voltage controlled oscillator 8 has an oscillating transistor 8a, a resonance circuit 8b coupled to a base of the oscillator transistor 8a, and two serially connected inductance elements 8c and 8d provided between a collector of the oscillating transistor 8a, which is an output terminal, and a power supply terminal Vcc, which is a high frequency ground point. The first inductance element 8c is provided at the side of the power supply terminal Vcc, and the second inductance element 8d is provided at the side of the collector. Also, the collector becomes a first output terminal, and a connecting point of the two inductance elements 8c and 8d becomes a second output terminal. Accordingly, the first output terminal is connected to the frequency divider 5. Also, the inductance values of two serially connected inductance elements 8c and 8d are selected so that the oscillating transistor 8a can oscillate in the collector ground type.

In the above-mentioned structure, the oscillating signal output from the collector, which is the first output terminal, includes the harmonic wave in addition to the fundamental wave. However, with respect to the level of the fundamental wave component, the level of the harmonic wave component is gradually reduced as the order of the harmonic wave is increased. Further, the oscillating signal output from the connecting point of the two inductance elements 8c and 8d, which is the second output terminal, also includes the harmonic wave in addition to the fundamental wave component, but the impedance of the first inductance element 8c is decreased with respect to the fundamental wave and is increased with respect to the harmonic wave. Therefore, the output of the fundamental wave component from the second output terminal is suppressed, and thus the harmonic wave component can be efficiently obtained. Accordingly, by adequately setting the ratio between the inductance values of the first inductance element 8c and the second inductance element 8d, the level of the harmonic wave of a target order can be increased, compared to the others.

Accordingly, the voltage controlled oscillator 8 stably oscillates with a frequency lower than the desired frequency, and thus the harmonic wave output from the voltage controlled oscillator can be used as the desired oscillating signal.

Figure 3:
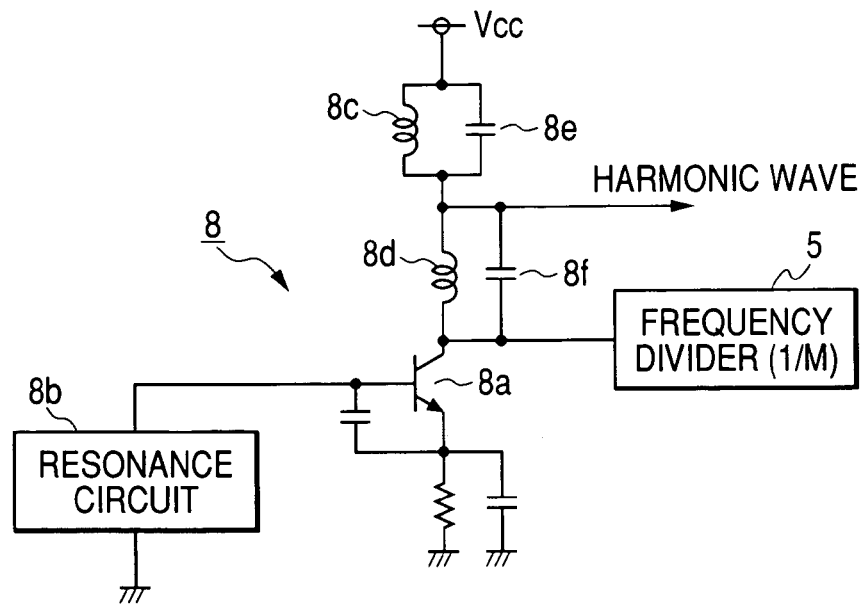
FIG. 3 is a circuit diagram showing the structure of the voltage controlled oscillator according to the present invention.

In addition, as shown in FIG. 3, if a parallel resonance circuit is constructed by connecting a first capacitive element 8e to the first inductance element 8c in parallel and the resonance frequency is equal to the frequency of the harmonic wave component having the desired order, only the harmonic wave component can be efficiently obtained. Further, by connecting a second capacitive element 8f to the second inductance element 8d in parallel, the level of the harmonic wave output from the second output terminal can be increased.

Figure 4:
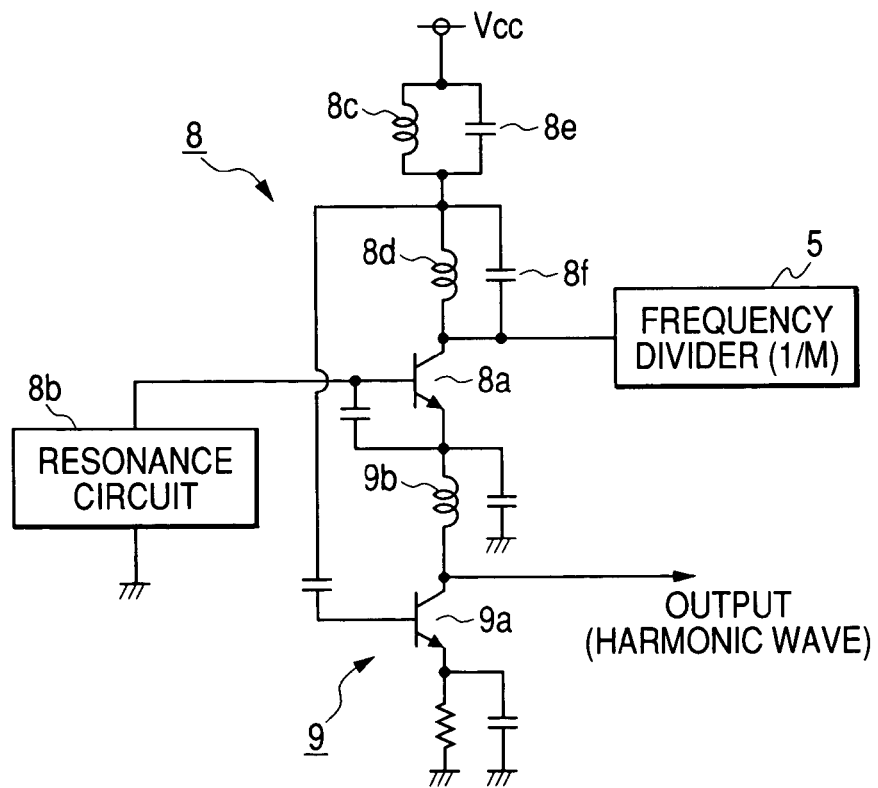
FIG. 4 is a circuit diagram showing the structure of the voltage controlled oscillator according to the present invention.
Figure 5:
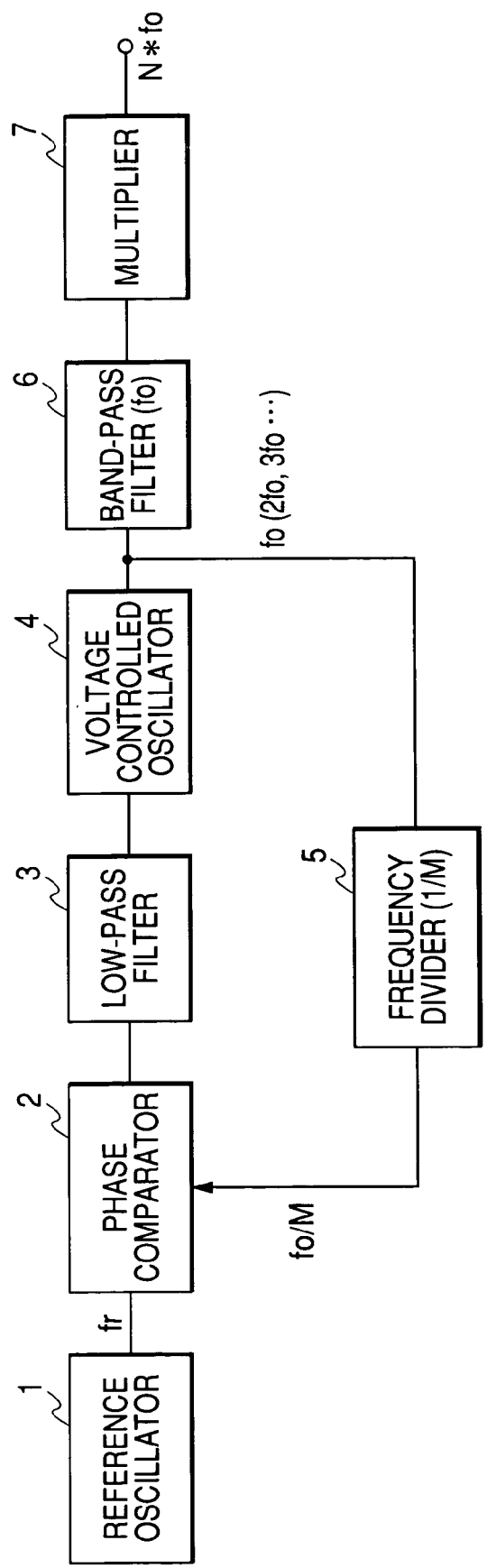
FIG. 5 is a circuit diagram of a conventional frequency synthesizer.

In FIG. 4, a buffer amplifier 9 for amplifying the harmonic wave component is provided, in which an emitter of an amplifying transistor 9a is grounded and a collector thereof is connected to the emitter of the oscillating transistor 8a through an inductance element 9b for preventing the harmonic wave. Therefore, a common collector current can flow out. Also, the amplified harmonic wave component is output from the collector.

What is claimed is:

1. A voltage controlled oscillator comprising:
an oscillating transistor; and
first and second inductance elements which are connected in series and provided between an output terminal of the oscillating transistor and a high frequency ground point,
wherein a fundamental wave is output from the output terminal of the oscillating transistor and a harmonic wave is output from a connecting point between the first inductance element and the second inductance element, respectively,
wherein the first inductance element is provided at the side of the high frequency ground point,
the second inductance element is provided at the side of the output terminal of the oscillating transistor, a first resonance circuit is constructed by connecting a first capacitive element to the first inductance element in parallel, a second resonance circuit is coupled to a base of the oscillating transistor, the first resonance circuit is operable to resonate with the frequency of a specific harmonic wave included in the oscillating signal a buffer amplifier for amplifying the oscillating signal is provided, and the connecting point between the first inductance element and the second inductance element is coupled to an input terminal of the buffer amplifier, the buffer amplifier has an amplifying transistor whose emitter is grounded, and a collector of the amplifying transistor is applied with a voltage from the emitter of the oscillating transistor, and a collector of the amplifying transistor is connected to the emitter of the oscillating transistor through an inductance element that is operable to suppress harmonic wave.

2. The voltage controlled oscillator according to claim 1, wherein a second capacitive element is connected to the second inductance element in parallel.

3. The voltage controlled oscillator according to claim 1, wherein the high frequency ground point is a power supply terminal, the output terminal of the oscillating transistor is a collector, and a power supply voltage is applied from the power supply terminal to the collector of the oscillating transistor through the first and second inductance elements.

4. The voltage controlled oscillator according to claim 1, wherein the voltage controlled oscillator is operative to oscillate with the fundamental wave; and wherein the harmonic wave is used as a desired oscillating signal.

* * * * *